US006829924B2

United States Patent
Nantz et al.

(10) Patent No.: US 6,829,924 B2
(45) Date of Patent: Dec. 14, 2004

(54) TIRE PRESSURE MONITORING SYSTEM WITH LOW FREQUENCY INITIATION APPROACH

(75) Inventors: John S. Nantz, Brighton, MI (US); Qingfeng Tang, Novi, MI (US); Ronald O. King, Brownstown, MI (US); Riad Ghabra, Dearborn Heights, MI (US); Keith Walker, Redford, MI (US); Art Turovsky, Southfield, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 10/322,006

(22) Filed: Dec. 17, 2002

(65) Prior Publication Data

US 2003/0164035 A1 Sep. 4, 2003

Related U.S. Application Data

(60) Provisional application No. 60/360,762, filed on Mar. 1, 2002.

(51) Int. Cl.[7] .............................................. G01M 17/02
(52) U.S. Cl. ........................................ 73/146; 73/146.4
(58) Field of Search ............................... 73/146–146.8, 73/700–756

(56) References Cited

U.S. PATENT DOCUMENTS

| | | | |
|---|---|---|---|
| 3,580,353 A | 5/1971 | Thompson | |
| 3,723,966 A | 3/1973 | Mueller et al. | |
| 3,916,688 A | 11/1975 | Dendy et al. | |
| 4,067,235 A | 1/1978 | Markland et al. | |
| 4,101,870 A | 7/1978 | Ekman | |
| 4,330,774 A | 5/1982 | Doty | |
| 4,450,431 A | 5/1984 | Hochstein | |
| 4,468,650 A | 8/1984 | Barbee | |
| 4,570,152 A | 2/1986 | Melton et al. | |

(List continued on next page.)

FOREIGN PATENT DOCUMENTS

| | | | |
|---|---|---|---|
| DE | 4232240 A | | 3/1994 |
| EP | 0 016 991 A | | 10/1980 |

(List continued on next page.)

OTHER PUBLICATIONS

William Schweber, Electronic Communication Systems, 1991, Prentice–Hall, Inc., pp. 91–93.

*Primary Examiner*—Edward Lefkowitz
*Assistant Examiner*—Jermaine Jenkins

(57) ABSTRACT

For use in a tire pressure monitoring system, an initiator generator includes an oscillator/divider configured to generate an output signal in response to a switched, regulated voltage. The output signal has a fundamental frequency and a gating frequency.

17 Claims, 1 Drawing Sheet

U.S. PATENT DOCUMENTS

| | | |
|---|---|---|
| 4,609,905 A | 9/1986 | Uzzo |
| 4,646,359 A | 2/1987 | Furrer |
| 4,660,528 A | 4/1987 | Buck |
| 4,670,845 A | 6/1987 | Etoh |
| 4,684,853 A | 8/1987 | Coash |
| 4,717,905 A | 1/1988 | Morrison, Jr. et al. |
| 4,749,993 A | 6/1988 | Szabo et al. |
| 4,761,830 A | 8/1988 | Izumi |
| 4,896,372 A | 1/1990 | Weaver |
| 4,951,208 A | 8/1990 | Etoh |
| 5,040,561 A | 8/1991 | Achterholt |
| 5,109,213 A | 4/1992 | Williams |
| 5,156,230 A | 10/1992 | Washburn |
| 5,165,497 A | 11/1992 | Chi |
| 5,289,160 A | 2/1994 | Fiorletta |
| 5,444,448 A | 8/1995 | Schuermann et al. |
| 5,451,959 A | 9/1995 | Schuermann |
| 5,461,385 A | 10/1995 | Armstrong |
| 5,463,374 A | 10/1995 | Armstrong |
| 5,473,938 A | 12/1995 | Handfield et al. |
| 5,479,171 A | 12/1995 | Schuermann |
| 5,483,827 A | 1/1996 | Kulka et al. |
| 5,485,381 A | 1/1996 | Heintz et al. |
| 5,500,637 A | 3/1996 | Kokubu |
| 5,515,014 A | 5/1996 | Troutman |
| 5,531,109 A * | 7/1996 | Tsagas ..................... 73/146.5 |
| 5,562,787 A | 10/1996 | Koch et al. |
| 5,573,610 A | 11/1996 | Koch et al. |
| 5,573,611 A | 11/1996 | Koch et al. |
| 5,585,554 A | 12/1996 | Handfield et al. |
| 5,600,301 A | 2/1997 | Robinson, III |
| 5,602,524 A | 2/1997 | Mock et al. |
| 5,612,671 A | 3/1997 | Mendez et al. |
| 5,654,689 A | 8/1997 | Peyre et al. |
| 5,661,651 A | 8/1997 | Geschke et al. |
| 5,677,667 A | 10/1997 | Lesesky et al. |
| 5,705,746 A | 1/1998 | Trost et al. |
| 5,708,403 A | 1/1998 | Morozumi et al. |
| 5,717,376 A | 2/1998 | Wilson |
| 5,724,028 A | 3/1998 | Prokup |
| 5,728,933 A | 3/1998 | Schultz et al. |
| 5,740,548 A | 4/1998 | Hudgens |
| 5,741,966 A | 4/1998 | Handfield et al. |
| 5,753,809 A | 5/1998 | Ogusu et al. |
| 5,760,682 A | 6/1998 | Liu et al. |
| 5,774,047 A | 6/1998 | Hensel, IV |
| 5,783,992 A | 7/1998 | Eberwine et al. |
| 5,822,683 A | 10/1998 | Paschen |
| 5,835,868 A | 11/1998 | McElroy et al. |
| 5,838,229 A | 11/1998 | Robinson, III |
| 5,844,130 A | 12/1998 | Hilgart et al. |
| 5,853,020 A | 12/1998 | Widner |
| 5,880,363 A | 3/1999 | Meyer et al. |
| 5,883,305 A | 3/1999 | Jo et al. |
| 5,900,808 A | 5/1999 | Lebo |
| 5,920,234 A | 7/1999 | Hill |
| 5,926,087 A | 7/1999 | Busch et al. |
| 5,929,620 A * | 7/1999 | Dobkin et al. .............. 323/288 |
| 5,939,977 A | 8/1999 | Monson |
| 5,942,971 A | 8/1999 | Fauci et al. |
| 5,959,365 A | 9/1999 | Mantini et al. |
| 5,963,128 A | 10/1999 | McClelland |
| 5,999,091 A | 12/1999 | Wortham |
| 6,002,327 A | 12/1999 | Boesch et al. |
| 6,025,777 A | 2/2000 | Fuller et al. |
| 6,034,596 A | 3/2000 | Smith et al. |
| 6,034,597 A | 3/2000 | Normann et al. |
| 6,043,738 A | 3/2000 | Stewart et al. |
| 6,043,752 A | 3/2000 | Hisada et al. |
| 6,053,038 A | 4/2000 | Schramm et al. |
| 6,060,984 A | 5/2000 | Braun et al. |
| 6,078,226 A | 6/2000 | Ajjikuttira |
| 6,087,930 A | 7/2000 | Kulka et al. |
| 6,111,520 A | 8/2000 | Allen et al. |
| 6,112,587 A | 9/2000 | Oldenettel |
| 6,118,369 A | 9/2000 | Boesch |
| 6,127,939 A | 10/2000 | Lesesky et al. |
| 6,169,480 B1 | 1/2001 | Uhl et al. |
| 6,175,302 B1 | 1/2001 | Huang |
| 6,181,241 B1 | 1/2001 | Normann et al. |
| 6,204,758 B1 | 3/2001 | Wacker et al. |
| 6,232,875 B1 | 5/2001 | DeZorzi |
| 6,232,884 B1 | 5/2001 | Gabbard |
| 6,239,753 B1 | 5/2001 | Kado et al. |
| 6,243,007 B1 | 6/2001 | McLaughlin et al. |
| 6,246,317 B1 | 6/2001 | Pickornik et al. |
| 6,252,498 B1 | 6/2001 | Pashayan, Jr. |
| 6,255,940 B1 | 7/2001 | Phelan et al. |
| 6,259,361 B1 | 7/2001 | Robillard et al. |
| 6,259,362 B1 | 7/2001 | Lin |
| 6,275,148 B1 | 8/2001 | Takamura et al. |
| 6,278,363 B1 | 8/2001 | Bezek et al. |
| 6,292,095 B1 | 9/2001 | Fuller et al. |
| 6,304,610 B1 | 10/2001 | Monson |
| 6,340,929 B1 | 1/2002 | Katou et al. |
| 6,362,731 B1 | 3/2002 | Lill |
| 6,369,703 B1 | 4/2002 | Lill |
| 6,384,720 B1 | 5/2002 | Juzswik et al. |
| 6,408,690 B1 | 6/2002 | Young et al. |
| 6,417,766 B1 | 7/2002 | Starkey |
| 6,441,728 B1 | 8/2002 | Dixit et al. |
| 6,489,888 B1 | 12/2002 | Honeck et al. |
| 6,501,372 B2 | 12/2002 | Lin |
| 6,518,877 B1 | 2/2003 | Starkey et al. |
| 6,543,279 B1 | 4/2003 | Yones et al. |
| 6,571,617 B2 | 6/2003 | Van Nickerk et al. |
| 6,581,449 B1 | 6/2003 | Brown et al. |
| 6,612,165 B2 | 9/2003 | Juzswik et al. |
| 2001/0008083 A1 | 7/2001 | Brown |
| 2003/0020605 A1 | 1/2003 | Starkey |
| 2003/0201879 A1 | 10/2003 | Munch et al. |

FOREIGN PATENT DOCUMENTS

| | | |
|---|---|---|
| EP | 0 646 985 A1 | 4/1995 |
| EP | 0671289 A1 | 9/1995 |
| EP | 0 753 897 A2 | 1/1997 |
| EP | 0 760 299 A1 | 3/1997 |
| EP | 1059177 | 12/2000 |
| EP | 1 113 582 A2 | 7/2001 |
| EP | 1 172 236 | 1/2002 |
| EP | 1 211 104 A2 | 6/2002 |
| EP | 1 215 056 A2 | 6/2002 |
| EP | 1215056 A3 | 6/2002 |
| EP | 1 262 339 A1 | 12/2002 |
| EP | 1 267 021 A1 | 12/2002 |
| FR | 2801728 A | 6/2001 |
| GB | 1483735 | 8/1977 |
| GB | 2179480 A | 3/1987 |
| GB | 2318696 A | 4/1998 |
| GB | 2363463 A | 12/2001 |
| GB | 2381972 A | 5/2003 |
| JP | 260212 A1 | 2/1990 |
| JP | 8244424 A | 9/1996 |
| JP | 10-107548 A | 4/1998 |
| JP | 2001-007712 A | 1/2001 |
| WO | WO 91/08614 | 6/1991 |
| WO | WO 96/15919 | 5/1996 |
| WO | WO 98/26946 | 6/1998 |
| WO | WO 99/29523 | 6/1999 |
| WO | WO 01/26069 A1 | 4/2001 |
| WO | WO 01/69803 | 9/2001 |

| | | | | | |
|---|---|---|---|---|---|
| WO | WO 01/76007 A1 | 10/2001 | WO | WO 02/072369 A1 | 9/2002 |
| WO | WO 01/81104 A1 | 11/2001 | | | |
| WO | WO 02/057097 | 7/2002 | * cited by examiner | | |

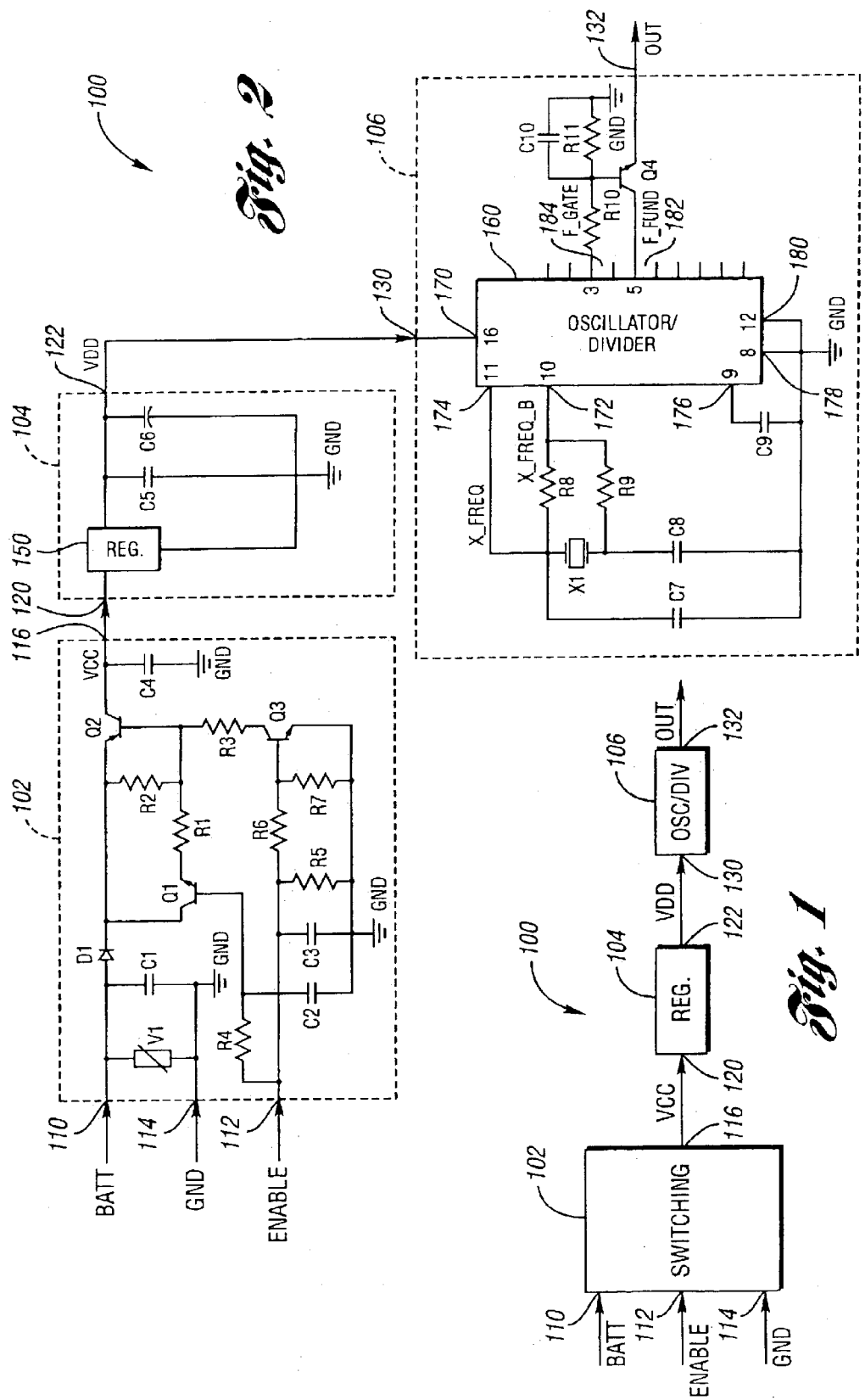

TIRE PRESSURE MONITORING SYSTEM WITH LOW FREQUENCY INITIATION APPROACH

CROSS-REFERENCE TO RELATED APPLICATION

This application claims the benefit of U.S. provisional application Ser. No. 60/360,762 filed Mar. 1, 2002.

BACKGROUND OF THE INVENTION

1. Field of the Invention

The present invention relates to a system and method for an initiator oscillator for use in tire pressure monitoring systems.

2. Background Art

It is known in the automotive industry to provide for wireless monitoring of vehicle tire parameters, particularly tire pressure. In such tire pressure monitoring systems, tire pressure sensors and radio frequency (RF) transmitters including initiators that have high frequency pre-driver and signal conditioning circuitry. In each tire, at least one signal that corresponds to the tire pressure sensed by the tire pressure sensor is processed by the high frequency pre-driver and signal conditioning circuitry (e.g., initiator oscillator circuitry) prior to being transmitted by the transmitter through an antenna to a receiver/controller located on the vehicle. The tire pressure information delivered to the receiver/controller by the RF signals from the transmitters is subsequently conveyed to a vehicle operator or occupant, typically using a display unit. In such a fashion, tire pressure monitoring systems can help to improve vehicle safety. Exemplary tire pressure monitoring systems are described and shown in U.S. Pat. Nos. 6,112,587 and 6,034,597.

Some conventional approaches to initiator oscillators (or generators) as implemented in tire pressure monitoring systems use expensive microprocessors to achieve the desired oscillator frequency generation accuracy and data generation. Additionally, some conventional approaches to initiator generators as implemented in tire pressure monitoring systems use double-ended enable input circuitry. Conventional microprocessor controlled circuitry and double-ended circuitry can be expensive to implement.

Thus, there exists a need for a system and a method for a low frequency initiation generator (e.g., high frequency pre-driver and signal conditioning circuitry) for use in a tire pressure monitoring system that achieves the desired frequency accuracy at a lower cost than conventional microprocessor based approaches via a single enable input and an oscillator/divider integrated circuit having crystal accuracy.

SUMMARY OF THE INVENTION

The present invention provides a system and a method for a low frequency initiation generator (e.g., high frequency pre-driver and signal conditioning circuitry) for use in a tire pressure monitoring system that achieves the desired frequency accuracy at a lower cost than conventional microprocessor based approaches via a single enable input and an oscillator/divider integrated circuit having crystal accuracy.

According to the present invention, for use in a tire pressure monitoring system, an initiator generator is provided comprising an oscillator/divider configured to generate an output signal in response to a switched, regulated voltage. The output signal has a fundamental frequency and a gating frequency.

Also according to the present invention, for use in a tire pressure monitoring system, a method of generating an initiator output signal is provided, the method comprising generating the output signal at a fundamental frequency in response to a switched, regulated voltage, and gating the output signal at a gating frequency.

Further, according to the present invention, a reduced power consumption tire pressure monitoring system initiator generator is provided comprising a switching circuit, a regulator, and an oscillator/divider. The switching circuit may be configured to generate a switched, unregulated voltage in response to a supply voltage and an enable signal. The regulator may be configured to generate a switched, regulated voltage in response to the unregulated voltage. The oscillator/divider maybe configured to generate an output signal in response to the switched, regulated voltage. The output signal has a fundamental frequency and a gating frequency.

The above features, and other features and advantages of the present invention are readily apparent from the following detailed descriptions thereof when taken in connection with the accompanying drawings.

BRIEF DESCRIPTION OF THE DRAWINGS

FIG. 1 is a diagram of a pre-driver and signal conditioning circuit of the present invention; and FIG. 2 is a detailed diagram of the pre-driver and signal conditioning circuit of FIG. 1.

DETAILED DESCRIPTION OF THE PREFERRED EMBODIMENT(S)

With reference to the Figures, the preferred embodiments of the present invention will now be described in detail. As previously noted, it is known in the automotive industry to provide for wireless monitoring of vehicle tire parameters, particularly tire pressure. In such tire pressure monitoring systems, tire pressure sensors and radio frequency (RF) transmitters including initiators that have high frequency pre-driver and signal conditioning circuitry. In each tire, the tire pressure sensed by the tire pressure sensor is processed by the high frequency pre-driver and signal conditioning circuitry (e.g., initiator oscillator circuitry) prior to being transmitted by the transmitter through an antenna to a receiver/controller located on the vehicle. The tire pressure information delivered to the receiver/controller by the RF signals from the transmitters is subsequently conveyed to a vehicle operator or occupant, typically using a display unit.

Generally, the present invention provides a system and a method for a low frequency initiation generator (e.g., high frequency pre-driver and signal conditioning circuitry implemented as an initiator) for use in a tire pressure monitoring system that achieves the desired frequency accuracy at a lower cost than conventional microprocessor based or double-ended input approaches via a single enable input and an oscillator/divider circuit having crystal accuracy.

Referring to FIG. 1, a diagram illustrating a generator 100 in accordance with a preferred embodiment of the present invention is shown. The generator 100 may be configured as an oscillator/divider circuit. The generator 100 may be advantageously implemented as a pre-driver and signal conditioner (or initiator) for a vehicle tire pressure monitoring system. The generator 100 may be configured to generate an output signal having a fundamental frequency that is gated at a lower frequency than the fundamental frequency and switched on and off in response to an enable signal. The generator 100 generally presents the output signal to a driver circuit (not shown). The driver circuit may be implemented as a single transistor, an FET, or any appropriate high current and high voltage device to meet the design criteria of a particular application. The embodiment of the generator 100 illustrated in FIGS. 1 and 2 may be advantageously implemented as an initiator for driving a differential FET current switch for powering a series RLC circuit for magnetic field generation in connection with a vehicle tire pressure monitoring system.

The generator 100 generally comprises a switching circuit (or block) 102, a regulator circuit (or block) 104, and an output circuit (or block) 106. The output circuit 106 is generally implemented (or configured) as an oscillator/divider circuit.

The switching circuit 102 may have an input 110 that may receive a system voltage (e.g., BATT), an input 112 that may receive an enable signal (e.g., ENABLE), an input 114 that may receive a ground potential (e.g., GND), and an output 116 that may present a supply voltage (e.g., VCC). The system voltage BATT may be a battery voltage that is provided by a battery (i.e., an unregulated voltage source, not shown) that is configured to provide electrical power to the generator 100.

The signal ENABLE may be a switching signal that switches the switching circuit 100 on (i.e., the signal ENABLE is asserted) when transmission of a signal (e.g., a tire pressure indication, not shown) generated in connection with the generator 100 is desired. The signal ENABLE is generally de-asserted when no signal transmission is desired. The generator 100 may, thus, conserve power (i.e., reduce power consumption) produced by the battery that provides the signal BATT. The supply voltage VCC is generally an unregulated or partially regulated voltage. For example, some transients on the signal BATT may be suppressed on the signal VCC. The switching circuit 102 generally switches the supply voltage VCC on and off in response to the assertion and de-assertion, respectively, of the signal ENABLE.

The regulator 104 may have an input 120 that may receive the signal VCC and an output 122 that may present a regulated supply voltage (e.g., VDD). The regulator 104 may be configured to present the regulated supply voltage VDD in response to the unregulated supply voltage VCC.

The oscillator/divider 106 may have an input 130 that may receive the supply voltage VDD and an output that may present a signal (e.g., OUT). The signal OUT generally has a fundamental frequency and is switched on an off (i.e., gated) at a gating frequency. The signal OUT is generally presented to additional circuitry (e.g., a driver circuit, not shown). In one example, the signal OUT may be implemented as an initiator signal for driving a differential FET current switch for powering a series RLC circuit for magnetic field generation in connection with a vehicle tire pressure monitoring system. The oscillator/divider 106 may be configured to present the signal OUT in response to the signal VDD.

Referring to FIG. 2, a detailed diagram of the generator 100 is shown. In one example, the switching circuit 102 comprises a varistor V1, a diode (or a transistor configured as a diode) D1, transistors Q1, Q2 and Q3, capacitances (e.g., capacitors, transistors configured as capacitors, etc.) C1, C2, C3, and C4, and resistances (e.g., resistors) R1, R2, R3, R4, R5, R6 and R7. The varistor V1 is generally configured to provide transient suppression to the input signal BATT. The transistors Q1, Q2 and Q3 are generally implemented as bipolar junction transistors (BJTs).

The varistor V1 may have a first terminal that may receive the supply voltage BATT and a second terminal that may receive the ground potential GND. The diode D1 may have an anode terminal that may receive the supply voltage BATT and a cathode terminal that may be connected to a node that includes a collector of the transistor Q1, an emitter of the transistor Q2, and a first terminal of the resistor R2. The capacitance C1 may have a first terminal that may receive the supply voltage BATT and a second terminal that may receive the ground potential GND.

The transistor Q1 may have a base that may be connected to a first terminal of the capacitance C2 and a first terminal of the resistor R4, and an emitter that may be connected to a first terminal of the resistor R1. The resistor R1 may have a second terminal that may be connected to a node that includes a second terminal of the resistor R2, a first terminal of the resistor R3 and a base of the transistor Q2. The transistor Q2 may have a collector that may be connected to a first terminal of the capacitance C4. The supply voltage VCC is generally presented at the collector of the transistor Q2.

The signal EN may be presented to a node that includes a second terminal of the resistor R4, a first terminal of the capacitance C3, and first terminals of the resistors R5 and R6. The transistor Q3 may have a collector that may be connected to a second terminal of the resistor R3, a base that may be connected to a second terminal of the resistor R6 and a first terminal of the resistor R7, and an emitter that may receive the ground potential GND. The capacitances C2, C3 and C4, and the resistors R5 and R7 may each have a second terminal that may receive the ground potential GND. However, the switching circuit 102 may be implemented as any appropriate switching circuit to meet the design criteria of a particular application.

In one example, the regulator 104 comprises an integrated circuit (IC) 150 and capacitances C5 and C6. The IC 150 is generally implemented as a voltage regulation circuit. In one example the IC 150 may be implemented as an LM-317. The IC 150 may have an input that may receive the supply voltage VCC, an input that may receive the ground potential GND, and output an output that may present the supply voltage VDD. The capacitances C5 and C6 may each have a first terminal that may be connected to the output of the IC 150 and a second terminal that may receive the ground potential GND. The capacitances C5 and C6 may be implemented as a single capacitance or as two or more capacitances. However, the regulator 104 may be implemented as any appropriate voltage regulation circuit to meet the design criteria of a particular application.

The oscillator/divider 106 generally comprises an IC 160, an element X1, a transistor Q4, capacitances C7, C8, C9 and C10, and resistors R8, R9, R10 and R11. In one example, the IC 160 may be implemented as a 4060 14-stage ripple carry binary counter (e.g., a Fairchild Semiconductor™ CD4060BC, or the like). However, the IC 160 may be implemented as any appropriate IC or discrete components that may be configured as an oscillator/divider to meet the design criteria of a particular application. The element X1 is generally implemented as an oscillator (e.g., a crystal oscillator, a ceramic resonator, etc.). The transistor Q4 is generally implemented as a BJT.

In a standard configuration, the IC 160 may be implemented as a 16-lead IC. The IC 160 may have inputs 170, 172, 174, 176, 178 and 180, and outputs 182 and 184 that may correspond to leads 16, 10, 11, 9, 8, 12, 5 and 3, respectively. The inputs 172, 174 and 176 may be implemented as clock (e.g., clocking signal) inputs. The input 170 may receive the supply voltage VDD. The input 172 may receive a signal (e.g., X_FREQ_B) and may be connected to a node that includes a first terminal of the resistors R8 and R9. The input 174 may receive a signal (e.g., X_FREQ) and may be connected to a node that includes a second terminal of the resistor R8 and first terminals of the element X1 and the capacitance C7. The signals X_FREQ and X_FREQ_B are generally complementary clocking signals having an oscillation frequency. The signals X_FREQ and X_FREQ_B may be generated by the element X1.

The element X1 may have a second terminal that may be connected to a second terminal of the resistor R9 and a first terminal of the capacitance C8. The input 176 may be connected to a first terminal of the capacitance C9. The inputs 178 and 180, second terminals of the capacitances C7, C8 and C9, and first terminals of the capacitance C10 and the resistor R11 may receive the ground potential GND.

The output 182 may present a signal (e.g., F_FUND) and may be connected to a collector of the transistor Q4. The output 184 may present a signal (e.g., F_GATE) and may be connected to a first terminal of the resistor R10. The transistor Q4 may have a base that may be connected to a node that includes second terminals of the capacitance C10 and the resistors R10 and R11. An emitter of the transistor Q4 generally presents the signal OUT.

The signals F_FUND and F_GATE may be generated having frequencies that are related to (e.g., the same as, a multiple of or a dividend of) the oscillation frequency of the element X1 (i.e., the frequency of the signals X_FREQ and X_FREQ_B). The IC 160 may be configured to generate the signals F_FUND and F_GATE in response to the signals X_FREQ and X_FREQ_B. The signal F_FUND generally has a frequency that is the fundamental frequency of the signal OUT. The signal F_GATE generally has a frequency that is the gating frequency of the signal OUT. The frequency of the signal F_GATE is generally lower than the frequency of the signal F_FUND. While the IC 160 has been shown having the signals F_FUND and F_GATE presented by the terminals 5 and 3, respectively, other terminals of the IC 160 (e.g., terminals 1, 2, 5, 7, 8, or 13–15) may be implemented to present one or the other or both of the signals F_FUND and F_GATE to meet the design criteria of a particular application.

The generator 100 generally presents the signal OUT having a fundamental frequency that is determined by the frequency of the signal F_FUND and gated (e.g., switched on ad off) at the frequency of the signal F_GATE when the signal ENABLE is asserted. The generator 100 is generally disabled when the signal ENABLE is de-asserted.

As is readily apparent from the foregoing description, then, the present invention generally provides a system (e.g., the generator 100) and a method for low frequency initiation circuitry (e.g., high frequency pre-driver and signal conditioning circuitry configured as an initiator oscillator) for use in a tire pressure monitoring system that achieves the desired frequency accuracy via a single enable input (e.g., via the signal ENABLE) and an oscillator/divider circuit (e.g., the output circuit 106) having crystal accuracy and stability (i.e., accuracy and stability derived from the crystal X1) and, thus, at a lower cost than conventional microprocessor based and double-ended input approaches.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. For use in a tire pressure monitoring system, an initiator generator comprising:
    an oscillator/divider configured to generate an output signal in response to a switched, regulated voltage, wherein the output signal has a fundamental frequency and a gating frequency, and the generator comprises a pre-driver/signal conditioning circuit configured to present the output signal to a driver circuit and to drive a differential FET current switch for powering a series RLC circuit for magnetic field generation.

2. The generator of claim 1 further comprising:
    a switching circuit configured to generate a switched, unregulated voltage in response to a supply voltage and an enable signal; and
    a regulator configured to generate the switched, regulated voltage in response to the unregulated voltage.

3. The generator of claim 1 wherein the oscillator/divider comprises an integrated circuit configured to generate the fundamental frequency and the gating frequency in response to the switched, regulated voltage and a signal having an oscillation frequency.

4. The generator of claim 3 wherein the fundamental frequency and the gating frequency are the same as, multiples of, or dividends of the oscillation frequency.

5. The generator of claim 3 wherein the signal having the oscillation frequency is generated by a crystal oscillator.

6. The generator of claim 1 wherein the generator is configured to drive a single transistor, an FET, a high current device, or a high voltage device.

7. For use in a tire pressure monitoring system, a method of generating an initiator output signal, the method comprising:
    generating the output signal at a fundamental frequency in response to a switched, regulated voltage;

gating the output signal at a gating frequency; and presenting the output signal to a differential FET current switch for powering a series RLC circuit for magnetic field generation.

8. The method of claim 7 further comprising generating the fundamental frequency and the gating frequency in response to an oscillation signal.

9. The method of claim 8 wherein the fundamental frequency and the gating frequency are the same as, multiples of, or dividends of a frequency of the oscillation signal.

10. The method of claim 8 further comprising generating the oscillation signal via a crystal oscillator.

11. The method of claim 7 further comprising:
    generating a switched, unregulated voltage in response to a supply voltage and an enable signal; and
    generating the switched, regulated voltage in response to the unregulated voltage.

12. The method of claim 7 further comprising:
    generating the output signal via a pre-driver/signal conditioning circuit; and
    presenting the output signal to a driver circuit.

13. The method of claim 7 further comprising presenting the output signal to a single transistor, an FET, a high current device, or a high voltage device.

14. A reduced power consumption tire pressure monitoring system initiator generator comprising:

a switching circuit configured to generate a switched, unregulated voltage in response to a supply voltage and an enable signal;

a regulator configured to generate a switched, regulated voltage in response to the unregulated voltage;

an oscillator/divider configured to generate an output signal in response to the switched, regulated voltage, wherein the output signal has a fundamental frequency and a gating frequency; and a pre-driver/signal conditioning circuit configured to present the output signal to a driver circuit and to drive a differential FET current switch for powering a series RLC circuit for magnetic field generation.

15. The generator of claim 14 wherein the oscillator/divider comprises an integrated circuit configured to generate the fundamental frequency and the gating frequency in response to the switched, regulated voltage and a signal having an oscillation frequency.

16. The generator of claim 15 wherein the signal having the oscillation frequency is generated by a crystal oscillator.

17. The generator of claim 15 wherein the fundamental frequency and the gating frequency are the same as, multiples of, or dividends of the oscillation frequency.

* * * * *